(12) United States Patent
Pan (10) Patent No.: US 7,018,887 B1
(45) Date of Patent: Mar. 28, 2006

(54) DUAL METAL CMOS TRANSISTORS WITH SILICON-METAL-SILICON STACKED GATE ELECTRODE

(75) Inventor: James Pan, Fishkill, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 107 days.

(21) Appl. No.: 10/788,281

(22) Filed: Mar. 1, 2004

(51) Int. Cl.
*H01L 21/8238* (2006.01)

(52) U.S. Cl. ..................... 438/225; 438/592

(58) Field of Classification Search ..................... None
See application file for complete search history.

(56) References Cited

U.S. PATENT DOCUMENTS

| | | | | |
|---|---|---|---|---|
| 6,027,961 | A  * | 2/2000 | Maiti et al. | 438/199 |
| 6,503,788 | B1 * | 1/2003 | Yamamoto | 438/231 |
| 6,881,631 | B1 * | 4/2005 | Saito et al. | 438/283 |
| 2003/0216038 | A1 | 11/2003 | Madhukar et al. | |

\* cited by examiner

*Primary Examiner*—Chandra Chaudhari (57) ABSTRACT

A method of forming dual metal CMOS transistors includes forming a first silicon layer on a gate dielectric layer provided on a substrate. A first metal layer is formed on the NMOS device areas. A second metal layer is formed on the PMOS device areas. These first and second metal layers consist of different metals. A second silicon layer is deposited on the first and second metal layers. A dry etching technique is performed to etch the second silicon layer, the first and second metal layers, and the first silicon layer. The dry etching stops on the gate dielectric layer, thereby forming gate electrodes. The first and second metal layers are reacted with the first and second silicon layers to form suicides in the gate electrodes.

21 Claims, 7 Drawing Sheets

DUAL METAL CMOS TRANSISTORS WITH SILICON-METAL-SILICON STACKED GATE ELECTRODE

FIELD OF THE INVENTION

The present invention is related to the field of semiconductor fabrication, and more particularly, to a fabrication process incorporating different gate metals for NMOS and PMOS devices.

BACKGROUND

In the semiconductor industry, it is normally desirable to fabricate NMOS (metal oxide semiconductors) and PMOS devices with matching threshold voltages. In conventional semiconductor processing, the NMOS and PMOS threshold voltages are conventionally adjusted by a combination of channel implants and selective doping of a polysilicon gate. It is generally effective in adjusting the threshold voltages for PMOS devices but less effective for NMOS devices. To overcome these problems, dual metal gate CMOS transistors have been provided, with the metals forming the gates being selected based on their work functions.

Traditional metal gate transistors are normally fabricated by dry etching of metal or metal capped with polysilicon, to form the gate. Dry etching of metal is extremely challenging, as it is difficult to ensure that the metal dry etch stops properly on the ultra-thin gate dielectric, such as a gate oxide. This failure to stop the dry etch on the gate oxide results in the loss of silicon in the source/drain areas, thereby causing increased leakage current.

These problems encountered in forming metal gate transistors are exacerbated when attempting to implement dual metal gate CMOS arrangements. As stated above, such metal dual metal gate CMOS arrangements are desirable to adjust the work function and the threshold voltages. However, the traditional approach for forming metal gate transistors is not readily applicable to forming dual metal gate CMOS transistors.

SUMMARY

There is a need for a dual metal gate CMOS fabrication process that prevents undesirable etching of the gate dielectric layer during the metal dry etch process in forming the gate. Such an arrangement would prevent loss of silicon in the source/drain areas and an increase in leakage current.

These and other needs are met by embodiments of the present invention which provide a method of forming dual metal CMOS transistors comprising the steps of forming a first silicon layer on a gate dielectric layer provided on a substrate, and forming a first metal layer on NMOS device areas. A second metal layer is formed on PMOS device areas, the first and second metal layers consisting of different metals. A second silicon layer is deposited on the first and second metal layers. The second silicon layer, the first and second metal layers, and the first silicon layer, are dry etched. The dry etching stops on the gate dielectric layer, and a gate electrode is formed. The first and second metal layers are then reacted with the first and second silicon layers to form silicides in the gate electrodes.

By providing a method of forming dual metal CMOS transistors that employs a silicon layer between the metal layer and the gate dielectric layer, the dry etching of the metal can safely stop on the silicon layer, preserving the gate dielectric layer and preventing loss of silicon in the source/drain areas and increased leakage current.

The foregoing and other features, aspects and advantages will become more apparent from the following detailed description when taken in conjunction with the accompanying drawings.

DETAILED DESCRIPTION

The present invention addresses and solves problems related to the formation of dual metal CMOS transistors, and in particular, to the problems in forming such dual metal CMOS transistors related to the metal dry etch process. In certain aspects of the invention, a silicon layer is provided in the gate below the different metals, and the metal dry etch process stops on this silicon layer. This prevents the unintended etching of the ultra-thin gate dielectric layer, such as gate oxide. By preventing the unintentional etching of the gate dielectric layer during a metal dry etch process, loss of silicon in the source/drain areas is prevented, as well as an increase in leakage current.

Figure 1:
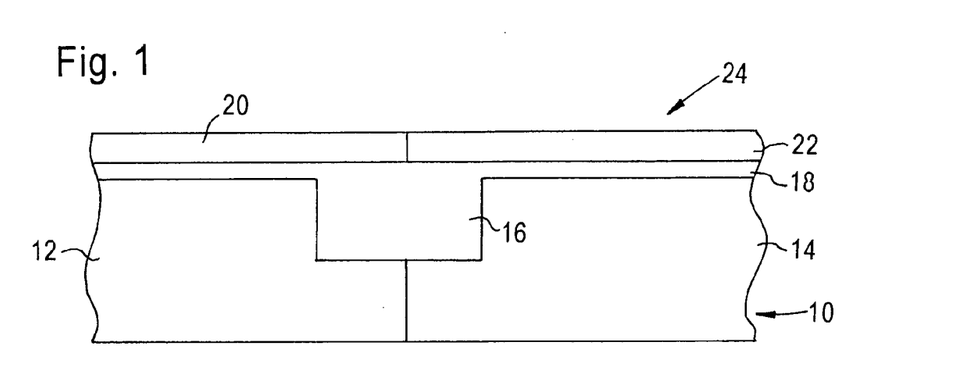
FIG. 1 is a schematic cross-sectional view of a semiconductor wafer during one phase of manufacture of dual metal CMOS transistors in accordance with the present invention.

FIG. 1 depicts a cross-sectional view of a portion of the semiconductor wafer from one stage of a semiconductor manufacturing process according to embodiments of the present invention. A partially completed semiconductor device is illustrated in FIG. 1. The device includes a substrate 10 formed of silicon, for example. The substrate 10 includes a p-doped region 12 and an n-doped region 14. The substrate 10 is doped with the n- or p-type dopants with a dose of between about $1\times10^{16}$ to about $1\times10^{21}$ ions/cm$^2$, for example.

A shallow trench isolation (STI) structure 16 provide separation between the p-doped region 12 and n-doped region 14 at the device level. Conventional STI formation methodology may be employed to create the shallow trench isolation region 16.

A gate dielectric layer 18 is formed on the substrate 10. The gate dielectric layer 18 may consist of a gate oxide, for example. In certain embodiments of the invention, the gate dielectric layer 18 is ultra-thin, and may be between about 5 to about 30 Å, for example. As described earlier, such a thin gate dielectric layer is readily susceptible to damage during a metal dry etch process. This could allow a loss of silicon in the source/drain areas that will ultimately be formed in the substrate 10. The loss of silicon causes increased leakage current.

In order to prevent the damage to the gate dielectric layer 18, a first silicon layer 24 is formed on the gate dielectric layer 18. An exemplary thickness of the first silicon layer 24 is between about 50 Å to about 200 Å. A conventional process may be employed for forming the first silicon layer 24, such as chemical vapor deposition (CVD) or other suitable deposition process.

A doping process is then performed, following the deposition of the first silicon layer 24, to form separate doped regions 20, 22 in the first silicon layer 24. For example, after deposition of the first silicon layer 24, a mask may be formed over region 22 and n-type dopants implanted into the first silicon layer 24 in the unmasked areas. These unmasked areas are the regions over the p-doped regions 12. The doping is a heavy doping, for example, such as between $1\times10^{19}$ to $1\times10^{21}$ ions/cm$^2$. Following the heavy doping of the n+ region 20 of the first silicon layer 24, the n+ doped region 20 is masked and p-type dopants are implanted into the first silicon layer 24 into regions 22. A heavy dose ($1\times10^{19}$ to $1\times10^{21}$ ions/cm$^2$, for example) produces a p+ silicon region 22. The mask over the n+ silicon region 20 is removed, leaving the n+ silicon region 20 and the p+ silicon region 22 forming the first silicon layer 24.

Figure 2:
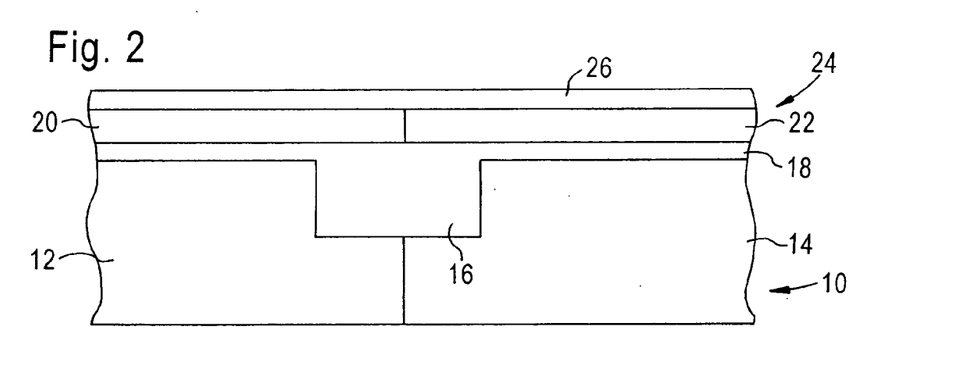
FIG. 2 depicts the structure of FIG. 1 following a deposition of a first metal layer in accordance with embodiments of the present invention.

In FIG. 2, a first metal layer 26 has been deposited by a suitable deposition technique over the first silicon layer 24. The first metal layer 26 may be deposited by any suitable technique, such as chemical vapor deposition. Since the gate dielectric layer 18 is protected, a greater latitude in deposition technique for depositing the first metal layer 26 may be employed. In the exemplary embodiment described, the metal in the first metal layer 26 is selected to be one suitable for use with NMOS transistors. Hence, the metal in the first metal layer 26 has a work function that is close to the conduction band of silicon. Exemplary metals include tantalum (Ta) and tantalum nitride (TaN). In embodiments of the invention, the thickness of the first metal layer 26 is between about 50 to about 200 Å.

Figure 3:
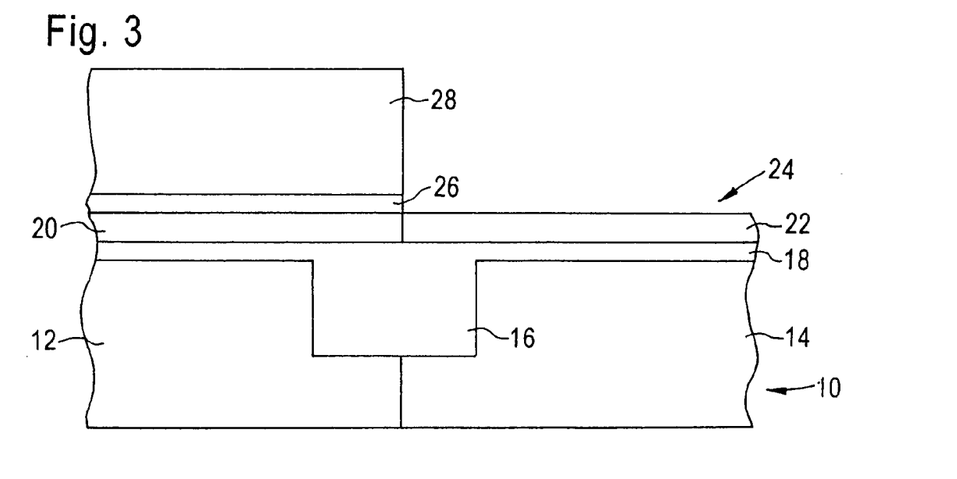
FIG. 3 shows the structure of FIG. 2 after a portion of the first metal layer has been etched in accordance with embodiments of the present invention.

FIG. 3 shows the structure of FIG. 2, after a mask 28 has been formed over the NMOS transistors, including the first metal layer 26. The exposed portion of the first metal layer 26, including those regions over the PMOS transistors, (i.e., over the p+ regions of the first silicon layer 24) are removed by etching. The etch may be a wet etch, for example, employing a suitable etchant material such as nitric acid or other appropriate etchant.

Figure 4:
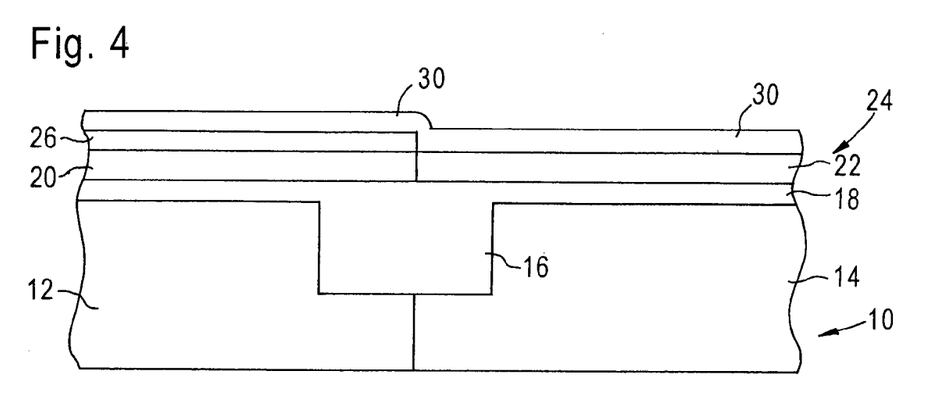
FIG. 4 depicts the structure of FIG. 3 following the deposition of a second metal layer in accordance with embodiments of the present invention.

FIG. 4 shows the structure of FIG. 3 following the removal of the mask 28 and the deposition of a second metal layer 30 in accordance with certain embodiments of the present invention. The second metal layer is deposited to a depth of between about 50 to about 200 Å, as was the first metal layer 26. The second metal layer 30 covers both the first metal layer 26 in the NMOS transistor regions, and the silicon layer 24 in the p+ regions 22 in the PMOS transistor areas.

The work function of the metal employed in the second metal layer 30 should have a work function close to the valence band of silicon. Suitable materials includes rhenium (Re) and ruthenium (Ru). Other materials may be employed without departing from the scope of the present invention.

Figure 5:
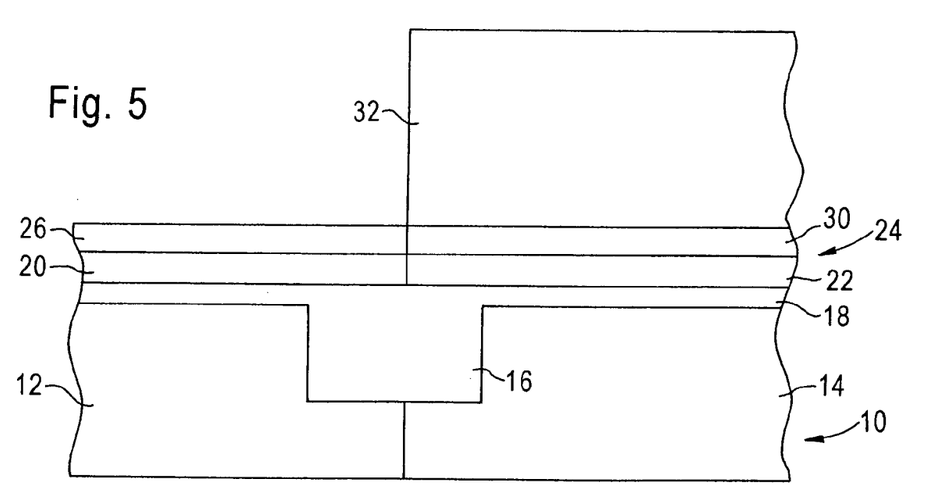
FIG. 5 depicts the structure of FIG. 4 following the removal of the second metal layer from portions of the semiconductor wafer in accordance with embodiments of the present invention.

FIG. 5 depicts the structure of FIG. 4 following the formation of a mask 32 over the second metal layer 30 in the PMOS transistor regions, i.e., over the p+ silicon regions 22. With the second metal layer 30 in the PMOS transistor regions effectively masked off, a timed, selective wet etch is performed to remove the second metal layer 30 from the first metal layer 26 in the NMOS transistor areas. An oxidizer may be used for the etchant, such as nitric acid. The wet etch time is a function of the thickness of the deposited second metal layer 30 and the etch rate of the etchant employed to etch the second metal layer 30.

Figure 4A:
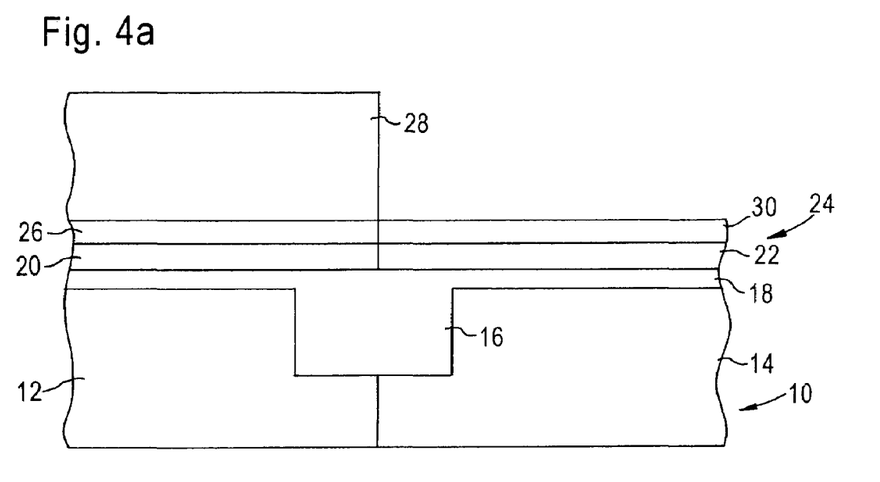
FIG. 4a depicts the structure of FIG. 3 following the deposition of a second metal layer in accordance with other embodiments of the present invention.
Figure 5A:
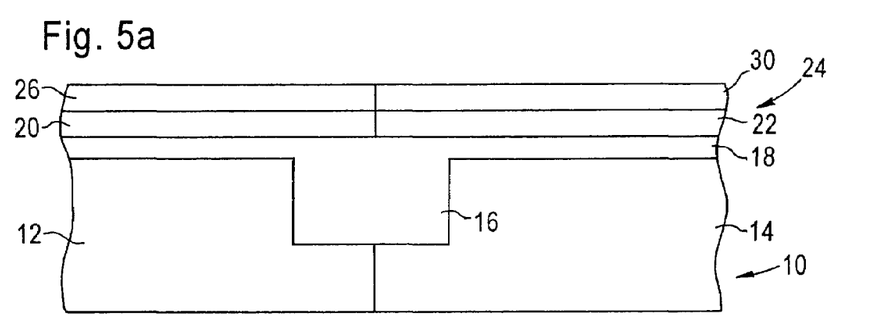
FIG. 5a depicts the structure of FIG. 4a after a resist has been removed, in accordance with embodiments of the present invention.

FIGS. 4a and 5a depict an alternate embodiment of performing the second metal layer 30. In these embodiments, the second metal layer 30 is deposited while the mask 28 still remains over the first metal layer 26 on the NMOS transistor regions. A conventional deposition process is performed to deposit the second metal layer 30 over the p+ silicon regions 42 of the first silicon layer 24. A lift-off technique leaves the structure of FIG. 5a in which the second metal layer 30 is provided only over the p+ region 22 over the first silicon layer 24, and the first silicon layer 26 is provided only over the n+ region 20 of the first silicon layer 24. This embodiment avoids additional masking and etching steps as depicted in FIGS. 4 and 5.

Figure 6:
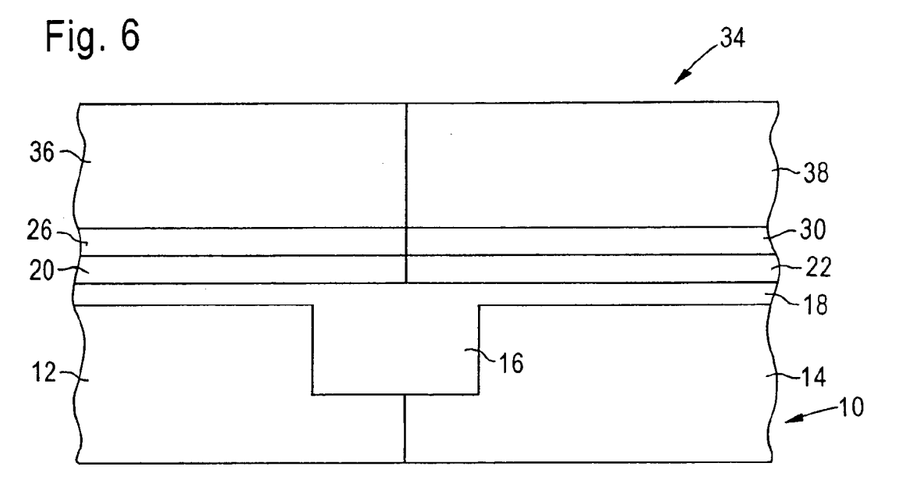
FIG. 6 depicts the structure of FIG. 5 or 5a after the deposition of a second silicon layer and dopant of the silicon layer in accordance with embodiments of the present invention.

FIG. 6 shows the structure of FIG. 5 or FIG. 5a following the deposition and doping of a second silicon layer 34. Through suitable masking and doping, an n+ region 36 is formed in the second silicon layer 34 over the first metal layer 26 in the NMOS transistor regions. Similarly, a masking and doping process is performed to create p+ regions 38 in the second silicon layer 34 over the second metal layer 30 in the PMOS transistor regions.

Figure 7:
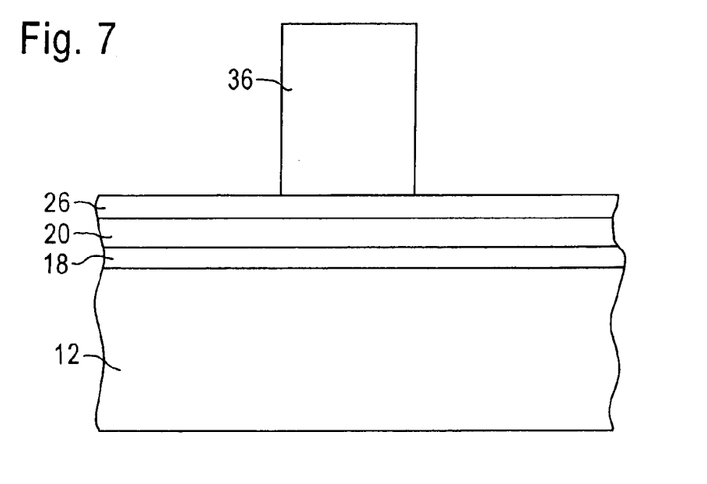
FIGS. 7–9 show the separate etching steps performed on the CMOS transistors to form a stacked gate electrode, in accordance with embodiments of the present invention.
Figure 8:
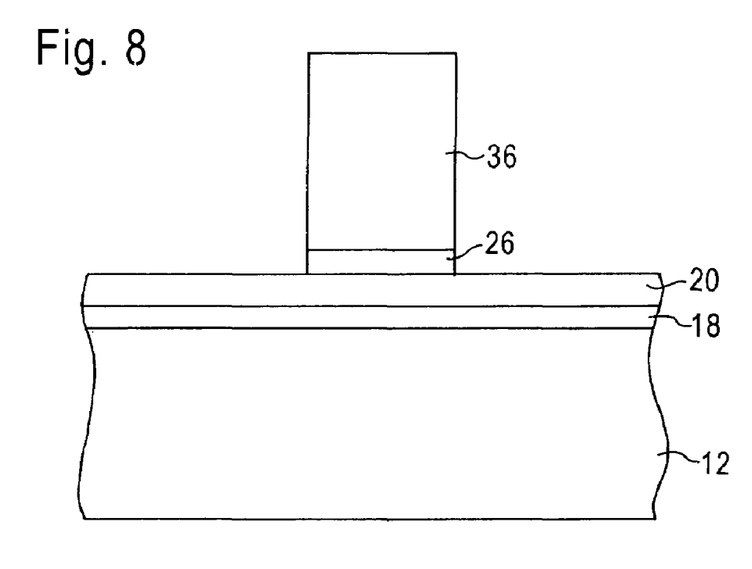
Figure 9:
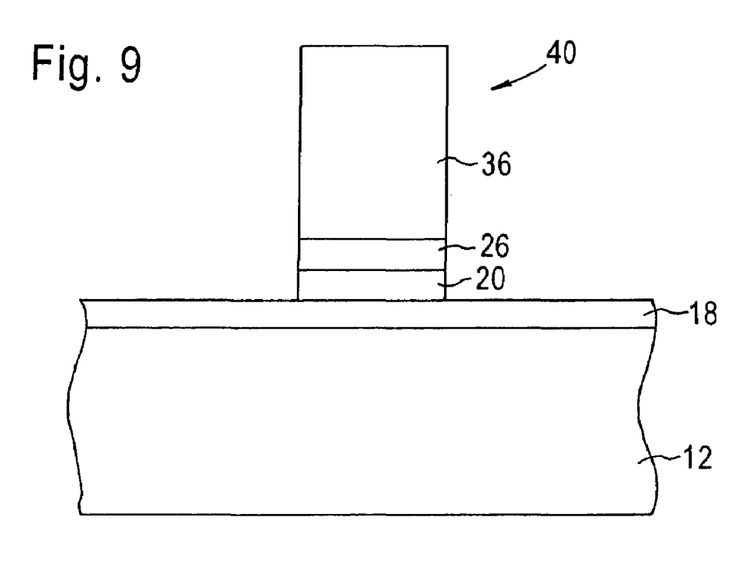

FIGS. 7–9 depict the etching of the layers to form a gate in one of the transistor regions, in this example, the NMOS transistor regions. However, only one transistor region is being depicted in FIGS. 7–9 for purposes of illustration only. During the etching process, it is desirable to etch the gates for the NMOS transistors as well as the PMOS transistors at the same time.

In FIG. 7, a polysilicon etching is performed with suitable etching chemistry to etch the second silicon layer 34, the etching stopping on the first metal layer 26. A reactive ion etch may be employed as the dry etch technique.

Following the etching of the second silicon layer 34, a metal dry etch is performed, also by reactive ion etching, for example, employing a conventional dry etching technique. Unlike conventional dual metal CMOS techniques, however, the metal etch process of FIG. 8 does not adversely affect the gate dielectric layer 18. The first silicon layer 24 effectively protects the ultra-thin gate dielectric layer 18 from the metal etching process. As can be seen, some of the silicon from the first silicon layer 24 may be etched during the metal dry etch process, as it is difficult to precisely stop the etching. However, since the gate dielectric layer 18 does not lie directly underneath the first or second metal layer 26, 30, the gate dielectric layer 18 is not adversely affected during the metal etch process. The substrate 10 is therefore not etched, which can lead to increased current leakage.

In FIG. 9, the stack 40 is completed by etching of the first silicon layer 24, stopping on the gate dielectric layer 18. The reactive ion etch process for etching polysilicon is much more controllable so that stopping on the gate dielectric layer 18 is readily achieved. A conventional polysilicon reactive ion etch technique and recipe, such as that used in FIG. 7, may be employed to etch the first silicon layer 24.

Figure 10:
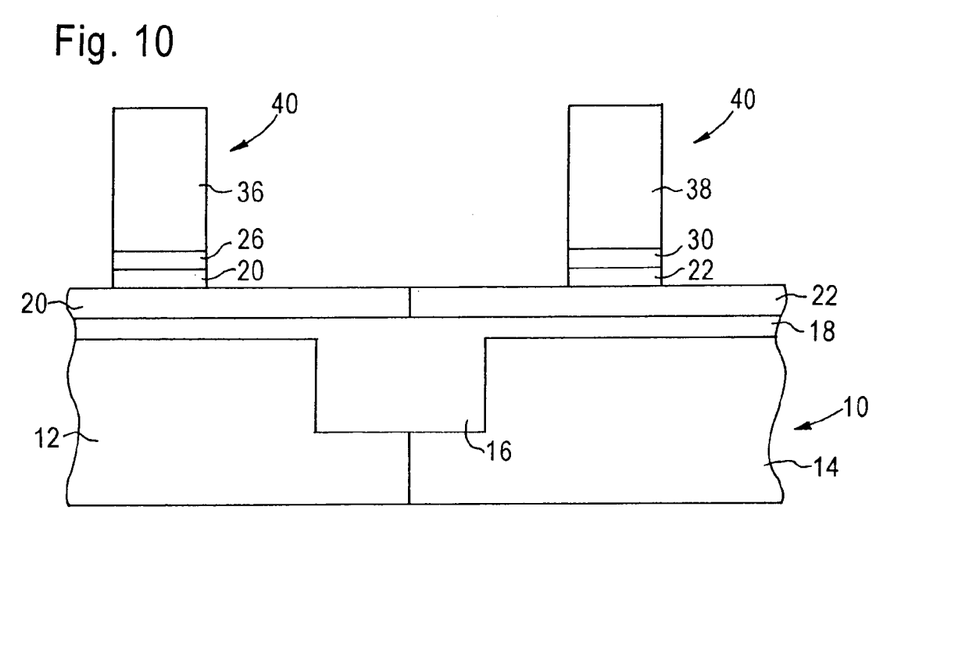
FIG. 10 depicts the dual metal CMOS transistors with stacked gate electrodes following the etching steps performed in FIGS. 7–9, in accordance with embodiments of the present invention.

FIG. 10 shows the structure after the etching of the second silicon layer 34, the first and second metal layers 26, 30, and the first silicon layer 24, in both the NMOS and PMOS transistor regions. As stated earlier, the etching processes are performed on the NMOS transistor regions and PMOS transistor regions simultaneously. The stacks 40 that are created are silicon-metal-silicon stacks. The use of the first silicon layer 24 serves as a protectant for the gate dielectric layer 18 during the metal dry etch process.

Figure 11:
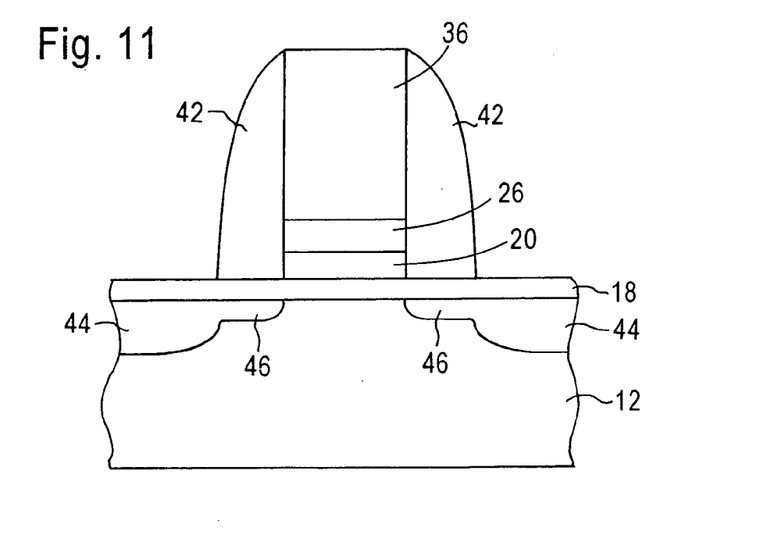
FIG. 11 shows the structure of FIG. 10 of a single one of the transistors, following spacer formation and source/drain extension and source/drain implant processes, in accordance with embodiments of the present invention.

With the stacks thus created, the source/drain extensions 46 are formed, as depicted in FIG. 11. The gate stack 40 is employed as a mask for the source/drain extension implant. Conventional energies and concentrations forming source/drain extensions may be employed. The implantation process involves masking the PMOS or NMOS transistor regions and performing appropriate implanting of the required dopants into the unmasked transistor regions. The same type of process of masking and implantation occurs before the PMOS transistor regions. Once the source/drain extensions 46 are formed for both the PMOS transistors and the NMOS transistors, a spacer formation process is performed to create spacers 42. The spacer formation process typically involves deposition of a spacer material, such as silicon nitride or silicon oxide, for example, followed by etching to create sidewall spacers 42. The sidewall spacer formation process is performed simultaneously over the PMOS and NMOS transistors in preferred embodiments.

Following the formation of the sidewall spacers 42, the source/drain regions 44 are created by appropriate implantation processes. This includes masking of the NMOS or PMOS transistor regions and ion implantation into the unmasked regions, followed by masking of the PMOS or NMOS transistor regions and appropriate ion implantation into the unmasked regions. The sidewall spacers 42 form a mask that prevents the heavy doping during the source/drain implantation process.

Figure 12:
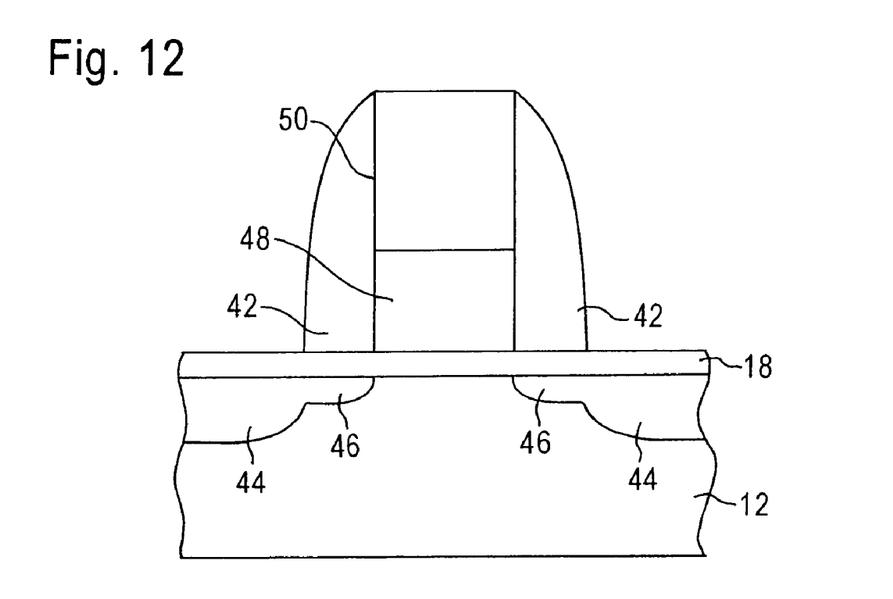
FIG. 12 depicts the structure of FIG. 11 following an annealing to form a silicide region in the gate electrode in accordance with embodiments of the present invention.

Following the implant steps, a rapid thermal anneal step is performed, as depicted in FIG. 12, thereby activating the implanted dopants and at the same time, creating a silicide region 48 in the gate electrode 50. The rapid thermal anneal process, which may involve heating at between 900° C. to about 1100° C. for about 1 to about 10 seconds, causes the metal in the first or second metal layers 26, 30 to react with the silicon in the first and second silicon layers 24, 34 to form a silicide.

An exemplary embodiment has been described in which the first metal layer that is formed is compatible with the NMOS devices and the second metal layer is compatible with the PMOS devices, and the process flows accordingly. It should be recognized by those of skill in the art that in the order of metal layer formation and ion implantation throughout the process can be reversed, such that the first metal layer is formed over the PMOS devices (using a metal compatible with the PMOS devices), and the second metal layer is formed over the NMOS devices (with a metal compatible with the NMOS devices). In other words, the order in which the PMOS and NMOS devices are formed may be reversed without departing from the scope of the present invention.

The present invention thus provides a process and arrangement for forming dual metal gate CMOS transistors that is readily manufacturable and avoids the loss of silicon in the source/drain areas and increased leakage currents. At the same time, the advantages of dual metal gate CMOS transistor technology is achieved.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming dual metal CMOS transistors comprising:

forming a first silicon layer on a gate dielectric layer provided on a substrate;

forming a first metal layer on NMOS device areas;

forming a second metal layer on PMOS device areas; the first and second metal layers consisting of different metals;

depositing a second silicon layer on the first and second metal layers;

dry etching the second silicon layer, the first and second metal layers, and the first silicon layer, stopping on the gate dielectric layer, to form a gate electrode; and reacting the first and second metal layers with the first and second silicon layers to form silicides in the gate electrodes.

2. The method of claim 1, wherein the step of dry etching includes sequentially dry etching the second silicon layer with a first etch recipe stopping on the first and second metal layers, the first and second metal layers stopping on the first silicon layer with a second etch recipe, and the first silicon layer with a third etch recipe stopping on the gate dielectric layer.

3. The method of claim 2, wherein the first metal layer consists of Ta or TaN.

4. The method of claim 2, wherein the second metal layer consists of Ru or Re.

5. The method of claim 2, wherein the first metal layer consists of Ta or TaN and the second metal layer consists of Ru or Re.

6. The method of claim 5, wherein the steps of forming the first and second metal layers include depositing the first metal layer on the first silicon layer, masking the first metal layer on the NMOS devices, etching the first metal layer from the PMOS devices, and depositing the second metal layer on the PMOS devices.

7. The method of claim 6, wherein the steps of forming the first and second metal layers further include unmasking the first metal layer prior to depositing the second metal layer and after the first metal layer is etched from the PMOS devices, masking the second metal layer on the PMOS devices, wet etching the second metal layer from the first metal layer, and unmasking the second metal layer on the PMOS devices.

8. The method of claim 7, wherein the gate dielectric layer is between about 5 Å to about 30 Å thick, the first silicon layer is between about 50 Å to about 200 Å thick, and the first and second metal layers are between about 50 Å to about 200 Å thick.

9. The method of claim 8, further comprising implanting dopants into the substrate, and activating the dopants to form active regions, the activating causing the first and second metal layers to react with the first and second silicon layers to form the silicides in the gate electrode.

10. The method of claim 9, wherein the step of activating includes heating at between 900° C. to about 1100° C. for between about 1 to about 10 seconds.

11. The method of claim 6, wherein the steps of forming the first and second metal layers further include lifting off the mask from the first metal layer after the second metal layer is deposited.

12. The method of claim 11, wherein the gate dielectric layer is between about 5 Å to about 30 Å thick, the first silicon layer is between about 50 Å to about 200 Å thick, and the first and second metal layers are between about 50 Å to about 200 Å thick.

13. The method of claim 12, further comprising implanting dopants into the substrate, and activating the dopants to form active regions, the activating causing the first and second metal layers to react with the first and second silicon layers to form the suicides in the gate electrode.

14. The method of claim 13, wherein the step of activating includes heating at between 900° C. to about 1100° C. for between about 1 to about 10 seconds.

15. The method of claim 7, wherein the step of wet etching the second metal layer includes performing a timed etch to etch the second metal layer from the first metal layer.

16. A method of forming dual metal CMOS transistors comprising:
   forming a first silicon layer on a gate dielectric layer provided on a substrate;
   forming a first metal layer on PMOS device areas;
   forming a second metal layer on NMOS device areas; the first and second metal layers consisting of different metals;
   depositing a second silicon layer on the first and second metal layers;
   dry etching the second silicon layer, the first and second metal layers, and the first silicon layer, stopping on the gate dielectric layer, to form a gate electrode; and
   reacting the first and second metal layers with the first and second silicon layers to form silicides in the gate electrodes.

17. The method of claim 16, wherein the step of dry etching includes sequentially dry etching the second silicon layer with a first etch recipe stopping on the first and second metal layers, the first and second metal layers stopping on the first silicon layer with a second etch recipe, and the first silicon layer with a third etch recipe stopping on the gate dielectric layer.

18. The method of claim 17, wherein the first metal layer consists of Ru or Re.

19. The method of claim 18, wherein the second metal layer consists of Ta or TaN.

20. The method of claim 19, wherein the steps of forming the first and second metal layers include depositing the first metal layer on the first silicon layer, masking the first metal layer on the PMOS devices, etching the first metal layer from the NMOS devices, and depositing the second metal layer on the NMOS devices.

21. The method of claim 20, wherein the steps of forming the first and second metal layers further include unmasking the first metal layer prior to depositing the second metal layer and after the first metal layer is etched from the NMOS devices, masking the second metal layer on the NMOS devices, wet etching the second metal layer from the first metal layer, and unmasking the second metal layer on the NMOS devices.

* * * * *